(12) United States Patent
Chen et al.

(10) Patent No.: US 11,302,658 B2
(45) Date of Patent: Apr. 12, 2022

(54) FAN-OUT ANTENNA PACKAGE STRUCTURE AND PACKAGING METHOD

(71) Applicant: SJ Semiconductor (Jiangyin) Corporation, Jiangyin (CN)

(72) Inventors: Yenheng Chen, Jiangyin (CN); Chengchung Lin, Jiangyin (CN); Chengtar Wu, Jiangyin (CN)

(73) Assignee: SJ SEMICONDUCTOR(JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 17/019,093

(22) Filed: Sep. 11, 2020

(65) Prior Publication Data

US 2020/0411456 A1 Dec. 31, 2020

Related U.S. Application Data

(62) Division of application No. 16/413,226, filed on May 15, 2019, now Pat. No. 10,804,229.

(30) Foreign Application Priority Data

Aug. 20, 2018 (CN) .......................... 201810947668.5
Aug. 20, 2018 (CN) .......................... 201821346590.3

(51) Int. Cl.
*H01L 23/66* (2006.01)
*H01L 23/00* (2006.01)
*H01Q 1/22* (2006.01)

(52) U.S. Cl.
CPC .............. *H01L 23/66* (2013.01); *H01L 24/17* (2013.01); *H01L 24/33* (2013.01); *H01L 24/85* (2013.01); *H01Q 1/2283* (2013.01); *H01L 2223/6611* (2013.01); *H01L 2223/6677* (2013.01)

(58) Field of Classification Search
None
See application file for complete search history.

(56) References Cited

U.S. PATENT DOCUMENTS

| | | | | |
|---|---|---|---|---|
| 2005/0173811 A1* | 8/2005 | Kinsman | ........... | H01L 27/14618 257/784 |
| 2018/0166405 A1* | 6/2018 | Chiang | ................... | H01L 24/02 |
| 2020/0373263 A1* | 11/2020 | Chen | ................... | H01L 23/5386 |

* cited by examiner

*Primary Examiner* — Alexander G Ghyka
(74) *Attorney, Agent, or Firm* — Alston & Bird LLP (57) ABSTRACT

The present disclosure provides a fan-out antenna packaging structure for a semiconductor chip and its fabricating method. The structure is a stacked-up two sets of metal connecting columns and antenna metal patterns arranged in two sequential layers of packaging materials sealing the chip. The two sets of metal interconnecting structures in the two layers of packaging materials may have different thicknesses. In some applications there can be more than two sets of the stacked-up antenna structures, fabricated around the chip at one side of a rewiring layer. The chip is interconnected to external metal bumps on the other side of the rewiring layer.

10 Claims, 5 Drawing Sheets

FAN-OUT ANTENNA PACKAGE STRUCTURE AND PACKAGING METHOD

CROSS REFERENCES TO RELATED APPLICATIONS

This application claims the benefits of priority to U.S. patent application Ser. No. 16/413,226, filed on May 15, 2019, entitled "FAN-OUT ANTENNA PACKAGE STRUCTURE AND PACKAGING METHOD", Chinese Patent Application No. CN 2018109476685, entitled "Fan-Out Antenna Package Structure and Packaging Method", filed with SIPO on Aug. 20, 2018, and Chinese Patent Application No. CN 2018213465903, entitled "Fan-Out Antenna Package Structure and Packaging Method", filed with SIPO on Aug. 20, 2018, the contents of which are incorporated herein by reference in its entirety.

TECHNICAL FIELD

The present disclosure relates to the field of semiconductor packaging technology, and in particular, to a fan-out antenna package structure and packaging method.

BACKGROUND

Integrated circuit packaging aims at obtaining packaging structures that are cheaper, more reliable and faster and have a higher packaging density. In the future, the integrated circuit density of various electronic devices will be improved by continuously reducing minimum feature sizes. At present, common packaging methods include Wafer Level Chip Scale Packaging (WLCSP), Fan-Out Wafer Level Package (FOWLP), Flip Chip, Package on Package (POP), and the like. With a large number of input/output (I/O) ports and good integration flexibly, the FOWLP has become one of the advanced packaging methods at present.

Increased demands for these popular high-tech electronic products have enabled more functions and applications configured into these high-tech products. In addition, to meet the need for mobilization, the function of wireless communication is provided.

In general, existing antenna structures in IC devices usually have many types, for examples, they are dipole antenna, monopole antenna, patch antenna, planar inverted-F antenna, meander line antenna, inverted-L antenna, loop antenna, spiral antenna and spring antenna. A known practice is to manufacture an antenna directly on the surface of a circuit board. By this practice, an antenna occupies an extra space of the circuit board, thereby resulting in a low integration level to the chip. For various electronic devices, a large circuit board means a large size. However, the main purpose of designing and developing these electronic devices is to allow users to carry them easily. Therefore, how to reduce the area of the circuit board occupied by an antenna, and improve the integration performance of an antenna packaging structure is the key to solve the problems of these electronic devices.

Based on the above, it is necessary to provide a packaging structure and packaging method for solving the problem caused by antenna occupying too much area of a circuit board.

SUMMARY

The present disclosure provides a fan-out antenna packaging structure for a semiconductor chip and its fabricating method. The structure is a stacked-up two sets of metal connecting columns and antenna metal patterns arranged in two sequential layers of packaging materials sealing the chip. The two sets of metal interconnecting structures in the two layers of packaging materials may have different thicknesses. In some applications there can be more than two sets of the stacked-up antenna structures, fabricated around the chip at one side of a rewiring layer. The chip is interconnected to external metal bumps on the other side of the rewiring layer.

The fan-out antenna package structure on a semiconductor chip, comprising: a rewiring layer, comprising a first surface and a second surface opposite to the first surface, wherein the semiconductor chip electrically connects to the second surface of the rewiring layer; a first metal connecting column, disposed on the second surface of the rewiring layer and electrically connected to the rewiring layer; a first packaging layer, deposited on the second surface of the rewiring layer, the first metal connecting column and the semiconductor chip, wherein a top surface of the first metal connecting column is exposed from a top surface of the first packaging layer; a first antenna metal layer, patterned on the top surface of the first packaging layer and electrically connected to the first metal connecting column; a second metal connecting column, disposed on the first antenna metal layer, wherein the second metal connecting column is aligned to the first metal connecting column; a second packaging layer, deposited on the first antenna metal layer and the plurality of second metal connecting columns, wherein top surfaces of the plurality of second metal connecting columns are exposed from a top surface of the second packaging layer; a second antenna metal layer, patterned on the top surface of the second packaging layer and electrically connected to the second metal connecting column; and a metal bump, disposed on the first surface of the rewiring layer.

Optionally, the semiconductor chip further comprises one or a combination of a metal column and a metal ball connected to a contact solder pad of the semiconductor chip Optionally, a side wall of the metal column of the semiconductor chip is embedded in the rewiring layer, and the metal column is electrically connected to the rewiring layer through the metal ball.

Optionally, the first metal connecting columns each is taller than the semiconductor chip.

Optionally, a first metal connecting block provided between the first metal connecting column and the rewiring layer, wherein the first metal connecting block has a lateral cross section larger than that of the first metal connecting column; and a second metal connecting block provided between the second metal connecting column and the first antenna metal layer, wherein the second metal connecting block has a lateral cross section larger than that of the second metal connecting column.

Optionally, Optionally, the second metal connecting column is shorter than the first metal connecting column.

Optionally, a material of the first packaging layer is one of epoxy resin, polyimide or gel; and a material of the second packaging layer is one of epoxy resin, polyimide or silica gel.

Optionally, the rewiring layer comprises a patterned dielectric layer, and a patterned metal wiring layer formed on the patterned dielectric layer.

Optionally, a material of the patterned dielectric layer is one or a combination of epoxy resin, a silica gel, PI, PBO, BCB, silicon oxide, phosphorosilicate glass, and fluorine-containing glass, and wherein a material of the metal wiring layer comprises one or a combination of copper, aluminum, nickel, gold, silver, and titanium.

Optionally, a material of the metal bump comprises one of copper, nickel, a tin bump and a silver bump.

The present disclosure further provides a method of fabricating a fan-out antenna for a semiconductor chip, comprising the following steps: S1: providing a supporting substrate, and forming a separation layer on the supporting substrate; S2: forming a rewiring layer on the separation layer, wherein the rewiring layer comprises a first surface in contact with the separation layer and a second surface opposite to the first surface; S3: forming a first metal connecting column on the second surface of the rewiring layer, wherein the first metal connecting column is electrically connected to the rewiring layer; S4: bonding the semiconductor chip to the second surface of the rewiring layer, wherein the semiconductor chip is electrically connected to the rewiring layer; S5: depositing a first packaging layer to cover the rewiring layer, the first metal connecting column and the semiconductor chip, and planarizing a top surface of the first packaging layer to expose a top surface of the first metal connecting column; S6: patterning a first antenna metal layer on the top surface of the first packaging layer, wherein the first antenna metal layer is electrically connected to the first metal connecting column; S7: forming a second metal connecting column on the first antenna metal layer, wherein the second metal connecting column is aligned to the first metal connecting column; S8: depositing a second packaging layer to cover the first antenna metal layer and the second metal connecting column, and planarizing a top surface of the second packaging layer to expose a top surface of the second metal connecting column; S9: patterning a second antenna metal layer on the top surface of the second packaging layer; S10: stripping off the separation layer, and removing the supporting substrate, to expose the first surface of the rewiring layer; and S11: forming a metal bump on the first surface of the rewiring layer.

Optionally, the supporting substrate is made of a material of glass, metal, semiconductor, polymer or ceramic; wherein the separation layer is made of an adhesive tape or a polymer film, wherein the polymer layer is cured by ultraviolet light or heat.

Optionally, forming of the rewiring layer in step S2 comprises the following steps: S2-1: forming a dielectric layer on the surface of the separation layer by using a physical vapor deposition process or a chemical vapor deposition process, and patterning the dielectric layer to form a patterned dielectric layer; and S2-2: forming a metal wiring layer on the patterned dielectric layer by using a physical vapor deposition process, a chemical vapor deposition process, an evaporation process, a sputtering process, an electroplating process or a chemical plating process, and etching the metal wiring layer to form a patterned metal wiring layer.

Optionally, step S2 further comprises repeating the step S2-1 and the step S2-2 up to N times, and wherein N is an integer.

Optionally, forming the first packaging layer in step S5 comprises one of compression molding, transfer molding, hydro-forming, vacuum lamination and spin coating; and wherein forming the second packaging layer in step S8 comprises one of compression molding, transfer molding, hydro-forming, vacuum lamination and spin coating.

Optionally, forming of the first metal connecting column in step S3 comprises the following steps: S3-1: forming a first metal connecting block on the second surface of the rewiring layer, where the first metal connecting block is electrically connected to the rewiring layer; and S3-2: forming the first metal connecting column on a top surface of the first metal connecting block by using a wire bonding process, where the first metal connecting block has a contacting area larger than that of the first metal connecting column.

Optionally, forming of the second metal connecting column in step S7 comprises the following steps: S7-1: forming a second metal connecting block on a top surface of the first antenna metal layer, where the second metal connecting block is electrically connected to the first antenna metal layer; and S7-2: forming a second metal connecting column on a top surface of the second metal connecting block by using a wire bonding process, where the second metal connecting block has a contacting area larger than that of the second metal connecting column.

DESCRIPTIONS OF REFERENCE NUMERALS

101 Supporting substrate
102 Separation layer
103 Rewiring layer
113 Dielectric layer
123 Metal wiring layer
104 First metal connecting column
114 First metal connecting block
105 Semiconductor chip
115 Metal column
125 Metal ball
106 First packaging layer
107 First antenna metal layer
108 Second metal connecting column
118 Second metal connecting block
109 Second packaging layer
110 Second antenna metal layer
111 Metal bump
S1 to S11 Fabrication Steps

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Figure 15:
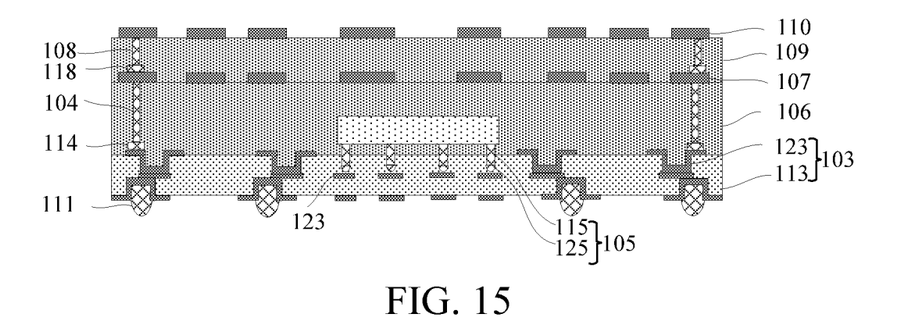
FIG. 15 shows the structural diagram of the completed fan-out antenna package structure according to the present invention.

As shown in FIG. 15, the present disclosure provides a fan-out antenna package structure. The package structure comprises: a rewiring layer 103, a first metal connecting column 104, a semiconductor chip 105, a first packaging layer 106, a first antenna metal layer 107, a second metal connecting column 108, a second packaging layer 109, a second antenna metal layer 110 and a metal bump 111.

Specifically, the rewiring layer 103 comprises a first surface and a second surface opposite to the first surface. The first metal connecting column 104 is disposed on the second surface of the rewiring layer 103 and is electrically connected to the rewiring layer 103. The semiconductor chip 105 is disposed on the second surface of the rewiring layer 103 and is electrically connected to the rewiring layer 103. The first packaging layer 106 encloses the rewiring layer 103, the first metal connecting column 104 and the semiconductor chip 105, and the first metal connecting column 104 exposes from the top surface of the first packaging layer 106. The first antenna metal layer 107 is disposed on the top surface of the first packaging layer 106, and is electrically connected to the first metal connecting column 104. The second metal connecting column 108 is disposed on the first antenna metal layer 107. The second packaging layer 109 encloses the first antenna metal layer 107 and the second metal connecting column 108, and the second metal connecting column 108 exposes from the top surface of the second packaging layer 109. The second antenna metal layer 110 is disposed on the top surface of the second packaging layer 109, and is electrically connected to the second metal connecting column 108. The metal bump 111 is disposed on the first surface of the rewiring layer 103. The rewiring layer 103, the first metal connecting column 104 and the second metal connecting column 108 in this embodiment are used to integrate the first antenna metal layer 107 and the second antenna metal layer 110, thereby improving the efficiency and performance of an antenna as well as the conformity of an antenna package structure. The semiconductor chip 105 is disposed in the first packaging layer 106 to reduce space, so that the volume of the package structure is further reduced, the integration and packaging performance of the antenna package structure are improved.

In this embodiment, the rewiring layer 103 comprises a patterned dielectric layer 113 and a patterned metal wiring layer 123 disposed on the patterned dielectric layer 113. Further, the dielectric layer 113 comprises one or a combination of an epoxy resin layer, a silica gel layer, a Polyimide (PI) layer, a Polybenzoxazole (PBO) layer, a Benzocyclobutene (BCB) layer, a silicon oxide layer, a phosphorosilicate glass layer, and a fluorine-containing glass layer, and the metal wiring layer 123 comprises one or a combination of a copper layer, an aluminum layer, a nickel layer, a gold layer, a silver layer, and a titanium layer. The number and types of the dielectric layer 113 and the metal wiring layer 123 in the rewiring layer 103 are not excessively limited herein.

In this embodiment, a first metal connecting block 114 is further provided between the first metal connecting column 104 and the rewiring layer 103. Preferably, the first metal connecting column 104 is disposed at a center of symmetry of the first metal connecting block 114, and the first metal connecting block 114 has a cross section larger than that of the first metal connecting column 104, thereby increasing a contact area between the first metal connecting block 114 and the metal wiring layer 123 to improve electric stability.

As shown in FIG. 15, the first metal connecting column 104 is disposed on the second surface of the rewiring layer 103, and is connected to the metal wiring layer 123 through the first metal connecting block 114. Further, the first metal connecting column 104 and the first metal connecting block 114 are made of one or a combination of Au, Ag, Cu and Al, which is not excessively limited herein.

In this embodiment, the semiconductor chip 105 electrically connected to the rewiring layer 103 further includes one or a combination of a metal column 115 and a metal ball 125 connected to a contact solder pad (not shown) of the semiconductor chip 105. The metal column 115 and the metal ball 125 can be directly used as an electric connection end of the semiconductor chip 105, to facilitate process operations and avoid performing a wire bonding process on the contact solder pad of the semiconductor chip 105, thereby improving the stability and yield of the semiconductor chip 105.

As shown in FIG. 15, the semiconductor chip 105 comprises the metal column 115 having a specific height and the metal ball 125 connected to the metal column 115. The metal column 115 has a height ranging from 25 μm to 250 μm. The metal column 115 and the metal ball 125 are made of one or a combination of copper, nickel, tin and silver. The number and type of the semiconductor chip 105 are not limited herein.

In this embodiment, lateral surfaces of the metal column 115 are enclosed by the dielectric layer 113 in the rewiring layer 103. The metal column 113 is electrically connected to the metal wiring layer 123 in the rewiring layer 103 through the metal ball 125. Because the lateral surfaces of the metal column 115 having a specific height are enclosed by the dielectric layer 113, the electric stability between the semiconductor chip 105 and the rewiring layer 103 can be further improved. Packaging efficiency can be improved by using the metal ball 125 at an end portion of the metal column 115. For example, after the rewiring layer 103 is coated with a flux and the semiconductor chip 105 is disposed at a corresponding position, the semiconductor chip 105 can be soldered on the rewiring layer 103 quickly and conveniently through reflow soldering, thereby implementing electric connection.

In this embodiment, the first metal connecting column 104 is higher than the semiconductor chip 105, that is, a total height of the first metal connecting column 104 and the first metal connecting block 114 is greater than the height of the partial semiconductor chip 105 exposed from the second surface of the rewiring layer 103. Therefore, the first packaging layer 106 can enclose the semiconductor chip 105 to protect the semiconductor chip 105. The first metal connecting column 104 is higher than the semiconductor chip 105, thereby providing a space for distribution of the first antenna metal layer 107, and increasing a distance between the first antenna metal layer 107 and the semiconductor chip 105. Therefore, the first antenna metal layer 107 can be distributed on the top surface of the first packaging layer 106, and the packaging performance is improved. The height of the first metal connecting column 104 preferably ranges from, but is not limited to, 100 μm to 400 μm.

Specifically, the first packaging layer 106 comprises one of an epoxy resin layer, a polyimide layer and a silica gel layer. The top surface of the first packaging layer 106 is a flat surface which has been grinded or polished, to improve the contact performance between the first antenna metal layer 107 and the first metal connecting column 104. The first antenna metal layer 107 may be made of Au, Cu, or the like, and the first antenna metal layer 107 may have various different patterns depending on a performance requirement, which is not limited herein.

In this embodiment, a second metal connecting block 118 is further provided between the first antenna metal layer 107 and the second metal connecting column 108 disposed on the first antenna metal layer 107, the second metal connecting block 118 has a cross section larger than that of the second metal connecting column 108. Preferably, the second metal connecting column 108 is disposed at a center of symmetry of the second metal connecting block 118, thereby increasing a contact area between the second metal connecting block 118 and the first antenna metal layer 107 to improve the electric stability. Further, the second metal connecting column 108 and the second metal connecting block 118 are made of one or a combination of Au, Ag, Cu and Al, which is not excessively limited herein.

In this embodiment, the second metal connecting column 108 is lower than the first metal connecting column 104, to further reduce the volume of the package structure.

Specifically, the second packaging layer 109 comprises one of an epoxy resin layer, a polyimide layer and a silica gel layer. The top surface of the second packaging layer 109 is a flat surface which has been grinded or polished, to improve the quality of the second antenna metal layer 110. The second antenna metal layer 110 may be made of Au, Cu or the like, and the second antenna metal layer 110 may have various different patterns depending on a performance requirement, which is not limited herein. As shown in FIG. 15, the second antenna metal layer 110 is formed on the second packaging layer 109, and the second antenna metal layer 110 protrudes from the surface of the second packaging layer 109.

In this embodiment, the metal bump 111 comprises one of a copper bump, a nickel bump, a tin bump and a silver bump. The metal bump 111 may further comprise a columnar metal connected to the metal bump 111, which is not limited herein.

As shown in FIG. 15, the semiconductor chip 105 is bonded to the second surface of the rewiring layer 103. The semiconductor chip 105 is electrically connected to the first antenna metal layer 107 and the second antenna metal layer 110 through the rewiring layer 103, the first metal connecting column 104 and the second metal connecting column 108, to implement function of antenna. According to this structure, an antenna package structure with more layers can be achieved by using more metal connecting columns, packaging layers and antenna metal layers, which is not limited herein. Therefore, integration of a plurality of antenna metal layers is achieved, thereby greatly improving the efficiency and performance of the antenna and further improving the conformity of the antenna package structure. The packaging volume is reduced, so that the antenna package structure has a higher level of integration.

Figure 1:
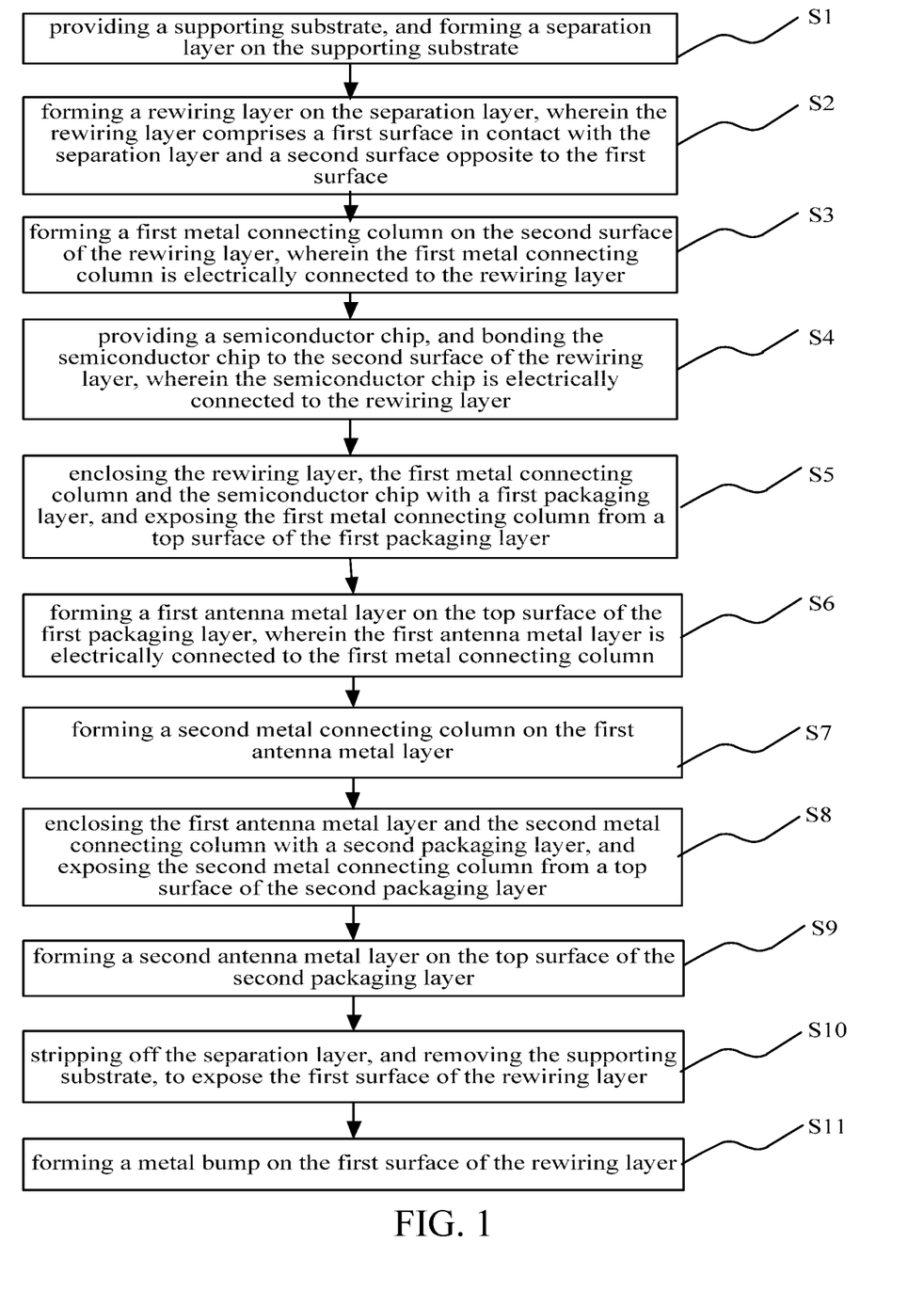
FIG. 1 shows a flowchart of the fabrication method for a fan-out antenna packaging according to the present disclosure.

As shown in FIG. 1, this embodiment further provides a fan-out antenna packaging method, comprising the following steps:

S1: Providing a supporting substrate, and form a separation layer on the supporting substrate.

S2: Forming a rewiring layer on the separation layer, where the rewiring layer comprises a first surface in contact with the separation layer and a second surface opposite to the first surface S3: Forming a first metal connecting column on the second surface of the rewiring layer, where the first metal connecting column is electrically connected to the rewiring layer.

S4: Providing a semiconductor chip, and bonding the semiconductor chip to the second surface of the rewiring layer, where the semiconductor chip is electrically connected to the rewiring layer.

S5: Enclosing the rewiring layer, the first metal connecting column and the semiconductor chip with a first packaging layer, and exposing the first metal connecting column from a top surface of the first packaging layer.

S6: Forming a first antenna metal layer on the top surface of the first packaging layer, where the first antenna metal layer is electrically connected to the first metal connecting column.

S7: Forming a second metal connecting column on the first antenna metal layer.

S8: Enclosing the first antenna metal layer and the second metal connecting column with a second packaging layer, and exposing the second metal connecting column from a top surface of the second packaging layer.

S9: Forming a second antenna metal layer on the top surface of the second packaging layer.

S10: Stripping off the separation layer, and removing the supporting substrate, to expose the first surface of the rewiring layer.

S11: Forming a metal bump on the first surface of the rewiring layer.

Specifically, in this embodiment, the first metal connecting column is formed before bonding the semiconductor chip, so that a bonding surface between the first metal connecting column and the rewiring layer is cleaner, and the stability of the first metal connecting column can be improved. The first packaging layer can be used to enclose the semiconductor chip while enclosing the first metal connecting column, thereby improving the stability of the semiconductor chip and reducing costs. A fan-out packaging method is used to package an antenna structure, which can effectively reduce the packaging volume, so that the antenna package structure achieves a higher level of integration and better packaging performance. FIGS. 2 to 15 show structural diagrams after each step in the antenna packaging method in the present disclosure.

Figure 2:
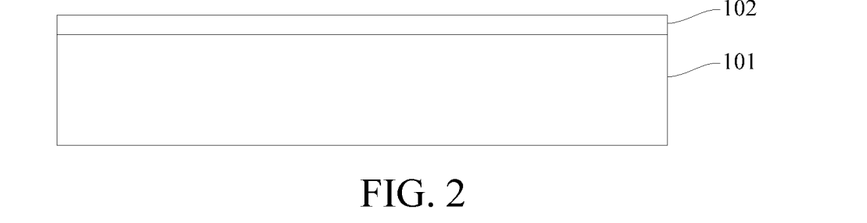
FIGS. 2 to 14 show structural diagrams after each step in fabricating the antenna packaging structure according to the present invention.

As shown in FIG. 2, step S1 is first performed to provide a supporting substrate 101 and form a separation layer 102 on the supporting substrate 101.

In this embodiment, the supporting substrate 101 comprises one of a glass substrate, a metal substrate, a semiconductor substrate, a polymer substrate and a ceramic substrate. In this embodiment, the supporting substrate 101 is preferably a glass substrate. The glass substrate is low in cost, and the separation layer 102 can be easily formed on the surface of the glass substrate. Moreover, the glass substrate can reduce the difficulty of a subsequent stripping process.

In this embodiment, the separation layer 102 includes one of an adhesive tape and a polymer layer. The polymer layer is first coated on the surface of the supporting substrate 101 by using a spin coating process, and then is cured by means of ultraviolet curing or thermal curing.

Specifically, in this embodiment, a polymer layer of an LTHC photothermal conversion layer is selected as the separation layer 102, so that the LTHC photothermal conversion layer can be heated by using laser in the subsequent step S10 to separate the supporting substrate 101 from the LTHC photothermal conversion layer.

Figure 3:
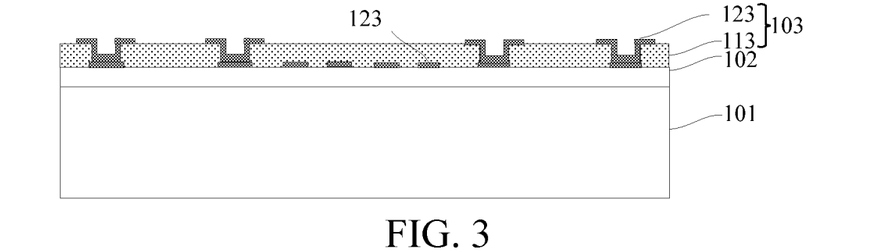

As shown in FIG. 3, step S2 is then performed to form a rewiring layer 103 on the separation layer 102, where the rewiring layer 103 comprises a first surface connected to the separation layer 102 and a second surface opposite to the first surface.

In this embodiment, manufacturing the rewiring layer 103 in step S2 comprises the following steps:

S2-1: Forming a dielectric layer 113 on the surface of the separation layer 102 by using a physical vapor deposition process or a chemical vapor deposition process, and patterning the dielectric layer 113 to form a patterned dielectric layer 113.

S2-2: Forming a metal wiring layer 123 on the surface of the patterned dielectric layer 113 by using a physical vapor deposition process, a chemical vapor deposition process, an evaporation process, a sputtering process, an electroplating process or a chemical plating process, and patterning the metal wiring layer 123 to form a patterned metal wiring layer 123.

Specifically, the dielectric layer 113 is made of one or a combination of epoxy resin, silica gel, PI, PBO, BCB, silicon oxide, phosphorosilicate glass, and fluorine-containing glass. The metal wiring layer 123 is made of one or a combination of copper, aluminum, nickel, gold, silver, and titanium. According to a requirement, step S2 may further include an N-cycle step formed by a combination of the step S2-1 and step S2-2 as required, where N≥1, which is not limited herein.

Figure 4:
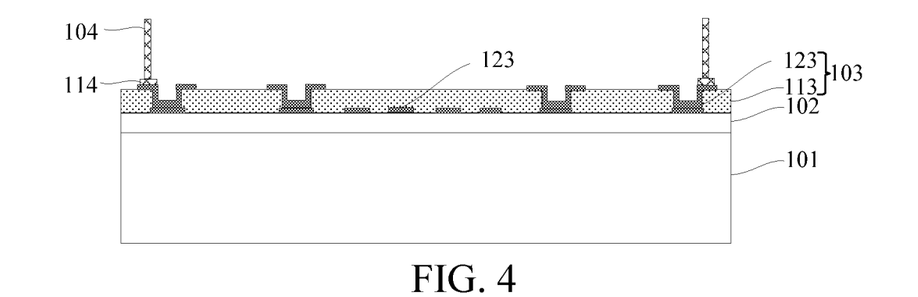

As shown in FIG. 4, step S3 is then performed to form a first metal connecting column 104 on the second surface of the rewiring layer 103, where the first metal connecting column 104 is electrically connected to the rewiring layer 103.

In this embodiment, forming the first metal connecting column 104 in step S3 includes the following steps:

S3-1: Forming a first metal connecting block 114 on a top surface of the rewiring layer 103, where the first metal connecting block 114 is electrically connected to the rewiring layer 103.

S3-2: Forming the first metal connecting column 104 on a top surface of the first metal connecting block 114 by using a wire bonding process, where the first metal connecting block 114 has a cross section larger than that of the first metal connecting column 104. Preferably, the first metal connecting column 104 is disposed at a center of symmetry of the first metal connecting block 114, thereby increasing a contact area between the first metal connecting block 114 and the metal wiring layer 123 to improve electric stability.

Specifically, the wire bonding process comprises one of a thermal compression wire bonding process, an ultrasonic wire bonding process and a thermal compression ultrasonic wire bonding process. The first metal connecting column 104 and the first metal connecting block 114 are made of one or a combination of Au, Ag, Cu, and Al.

Figure 5:
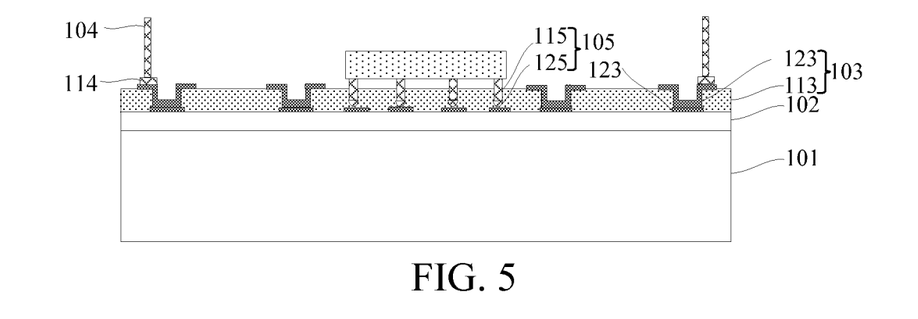

As shown in FIG. 5, step S4 is then performed to provide a semiconductor chip 105. The semiconductor chip 105 is bonded to the second surface of the rewiring layer 103, and electrically connected to the rewiring layer 103. The number and type of the semiconductor chip 105 are not limited herein.

Specifically, the semiconductor chip 105 further includes the metal column 115 having a specific height and the metal ball 125 connected to the metal column 115. The metal column 115 has a height ranging from 25 μm to 250 μm. The metal column 115 and the metal ball 125 are made of one or a combination of copper, nickel, tin and silver. Lateral surfaces of the metal column 115 are wrapped by the dielectric layer 113 in the rewiring layer 103. The metal column 113 is electrically connected to the metal wiring layer 123 in the rewiring layer 103 through the metal ball 125. Because the lateral surfaces of the metal column 115 having a specific height are enclosed by the dielectric layer 113, the electric stability between the semiconductor chip 105 and the rewiring layer 103 can be further improved. Packaging efficiency can be improved by using the metal ball 125 at an end portion of the metal column 115. For example, the rewiring layer 103 is coated with a flux, and the semiconductor chip 105 is disposed at a corresponding position, then the semiconductor chip 105 is soldered on the rewiring layer 103 quickly and conveniently through reflow soldering, thereby implementing electric connection.

In this embodiment, the first metal connecting column 104 is higher than the semiconductor chip 105, that is, a total height of the first metal connecting column 104 and the first metal connecting block 114 is greater than the height of the partial semiconductor chip 105 exposed from the second surface of the rewiring layer 103. Therefore, the first packaging layer 106 can enclose the semiconductor chip 105 to protect the semiconductor chip 105. The first metal connecting column 104 is higher than the semiconductor chip 105, thereby providing a space for distribution of the first antenna metal layer 107, and increasing a distance between the first antenna metal layer 107 and the semiconductor chip 105. Therefore, the first antenna metal layer 107 can be distributed on the top surface of the first packaging layer 106, and the packaging performance is improved. The height of the first metal connecting column 104 is preferably, but not limited to, 100 μm to 400 μm.

Figure 6:
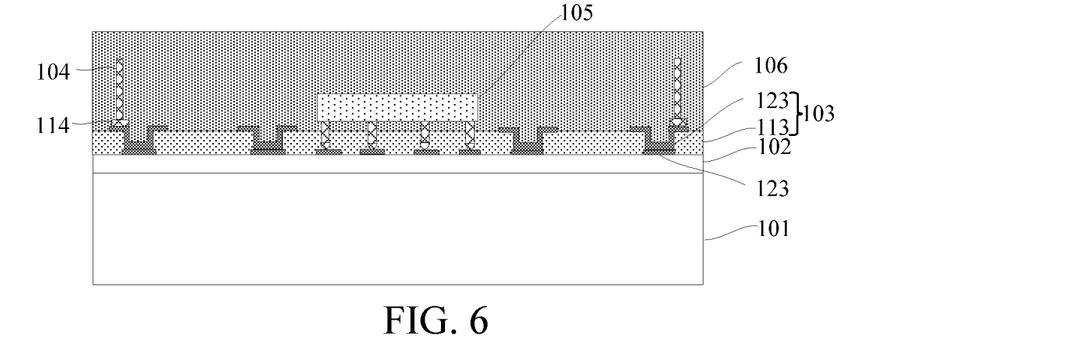
Figure 7:
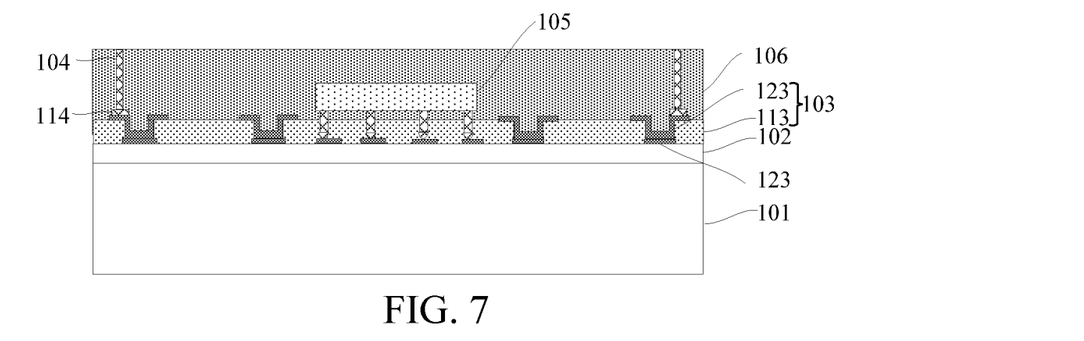

As shown in FIG. 6 and FIG. 7, step S5 is then performed to enclose the rewiring layer 103, the first metal connecting column 104 and the semiconductor chip 105 with a first packaging layer 106, where the first metal connecting column 104 is expose from a top surface of the first packaging layer 106.

In this embodiment, forming the first packaging layer 106 in step S5 includes applying one of the techniques of compression molding, transfer molding, hydro-forming, vacuum lamination and spin coating. The first packaging layer 106 is made of one of polyimide, silica gel and epoxy resin.

Specifically, after the first packaging layer 106 is formed, the method further includes grinding or polishing the top surface of the first packaging layer 106, so as to provide a flat top surface of the first packaging layer 106 to improve the quality of the subsequently formed first antenna metal layer.

Figure 8:
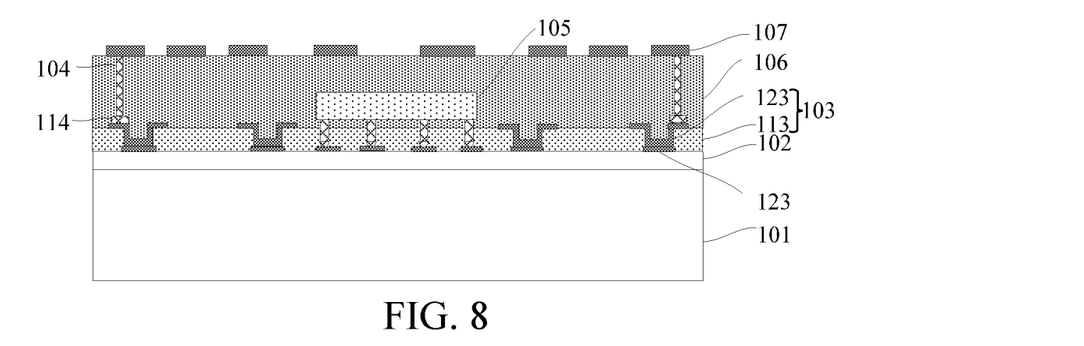

As shown in FIG. 8, step S6 is then performed to form a first antenna metal layer 107 on the top surface of the first packaging layer 106, where the first antenna metal layer 107 is electrically connected to the first metal connecting column 104.

Specifically, the first antenna metal layer 107 can be formed on the top surface of the first packaging layer 106 by using a physical vapor deposition process, a chemical vapor deposition process, an evaporation process, a sputtering process, an electroplating process or a chemical plating process, and then the required patterned first antenna metal layer 107 is formed by using an etching process.

Figure 9:
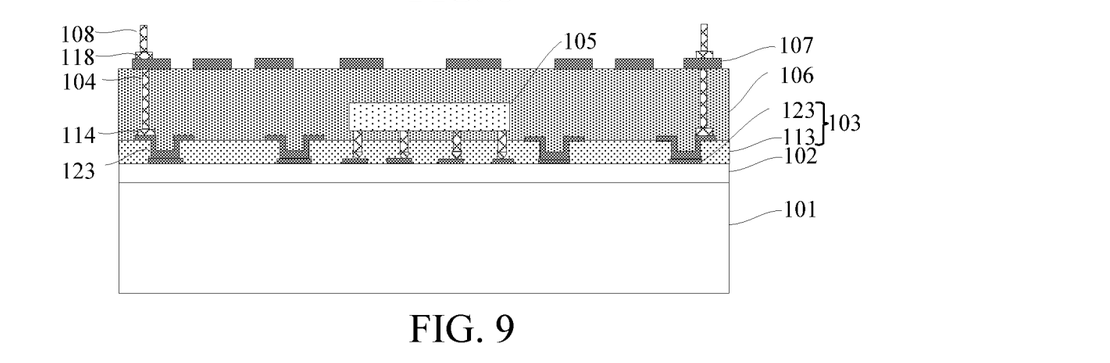

As shown in FIG. 9, step S7 is then performed to form a second metal connecting column 108 on the first antenna metal layer 107.

In this embodiment, forming the second metal connecting column 108 in step S7 comprises the following steps:

S7-1: Forming a second metal connecting block 118 on a top surface of the first antenna metal layer 107, where the second metal connecting block 118 is electrically connected to the first antenna metal layer 107.

S7-2: Forming a second metal connecting column 108 on an upper surface of the second metal connecting block 118 by using a wire bonding process, where the second metal connecting block 118 has a cross section larger than that of the second metal connecting column 108. Preferably, the second metal connecting column 108 is disposed at a center of symmetry of the second metal connecting block 118, thereby increasing a contact area between the second metal connecting block 118 and the first antenna metal layer 107 to improve the electric stability.

Specifically, the wire bonding process includes one of a thermal compression wire bonding process, an ultrasonic wire bonding process and a thermal compression ultrasonic wire bonding process. The second metal connecting column 108 is made of one or a combination of Au, Ag, Cu, and Al, the second metal connecting block 118 is made of one or a combination of Au, Ag, Cu, and Al.

Figure 10:
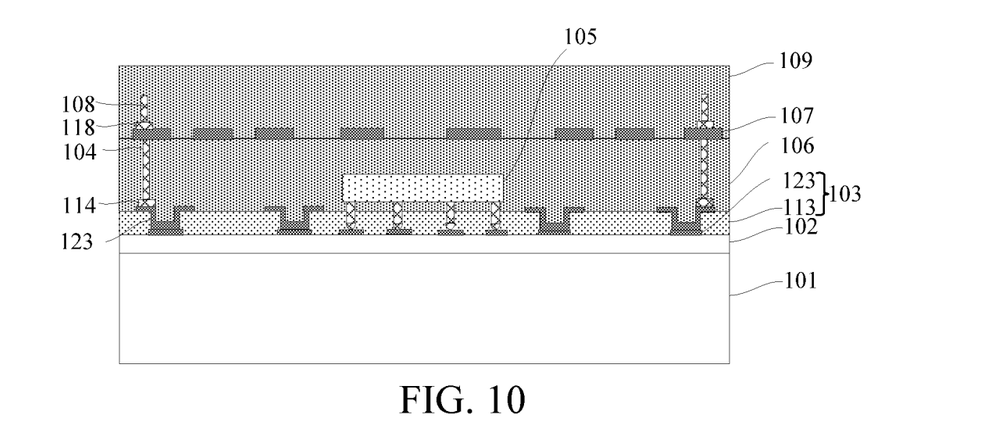
Figure 11:
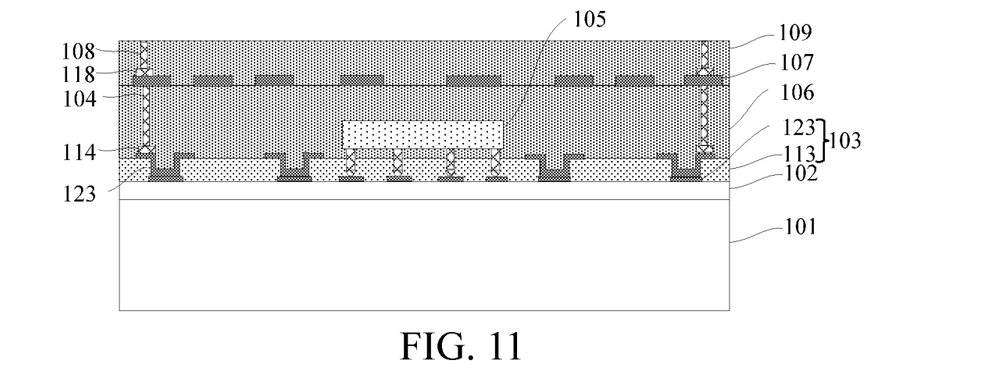

As shown in FIG. 10 and FIG. 11, step S8 is then performed to enclose the first antenna metal layer 107 and the second metal connecting column 108 with a second packaging layer 109. The second metal connecting column 108 is exposed from a top surface of the second packaging layer 109.

In this embodiment, forming the second packaging layer 109 in step S8 includes one of compression molding, transfer molding, hydro-forming, vacuum lamination and spin coating. The second packaging layer 109 is made of one or a combination of polyimide, silica gel and epoxy resin.

Specifically, after the second packaging layer 109 is formed, the method further comprises grinding or polishing the top surface of the second packaging layer 109, to provide a flat top surface of the second packaging layer 109 to improve the quality of the subsequently formed second antenna metal layer.

Figure 12:
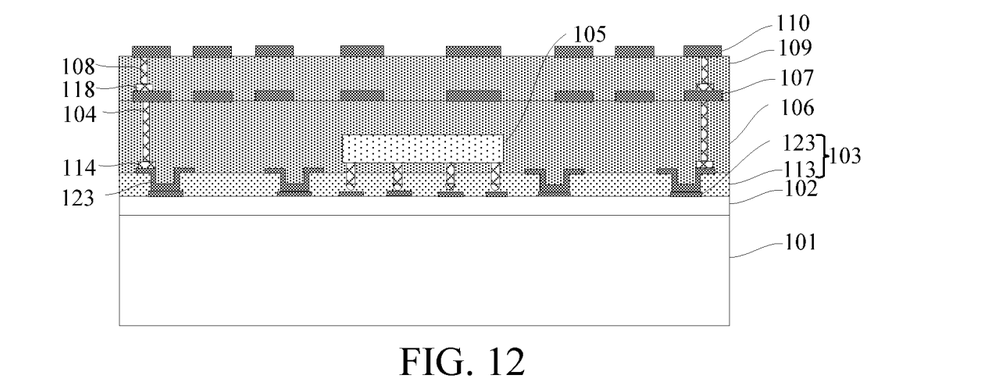

As shown in FIG. 12, step S9 is then performed to form a second antenna metal layer 110 on the top surface of the second packaging layer 109, where the second antenna metal layer 110 is electrically connected to the second metal connecting column 108.

Specifically, the second antenna metal layer 110 can be formed on the top surface of the second packaging layer 109 by using a physical vapor deposition process, a chemical vapor deposition process, an evaporation process, a sputtering process, an electroplating process or a chemical plating process, and then the required patterned second antenna metal layer 110 is formed by using an etching process.

Figure 13:
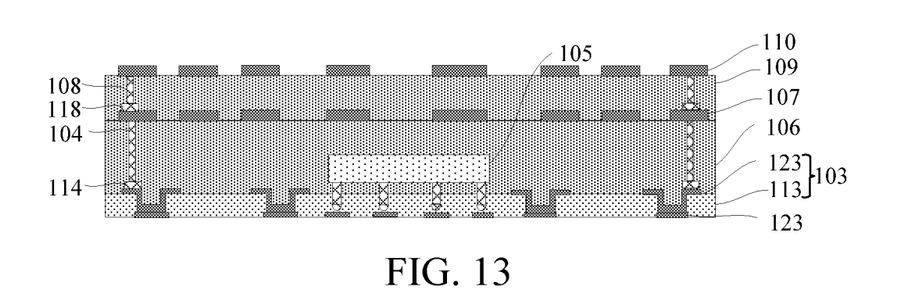

As shown in FIG. 13, step S10 is then performed to strip off the separation layer 102, and remove the supporting substrate 101, to expose the first surface of the rewiring layer 103.

Specifically, the LTHC photothermal conversion layer is heated by using laser to separate the supporting substrate 101 from the LTHC photothermal conversion layer.

Figure 14:
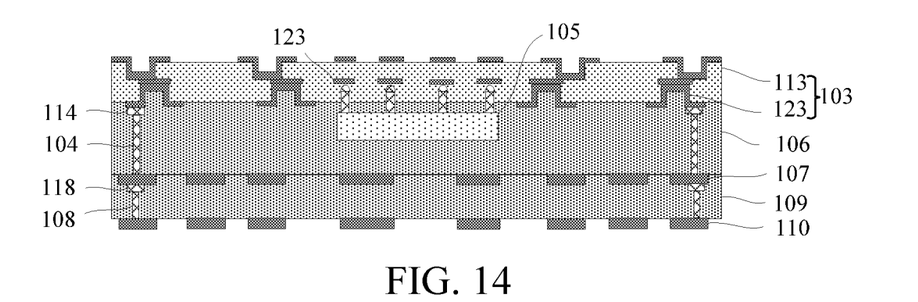

As shown in FIG. 14 and FIG. 15, step S11 is then performed to form a metal bump 111 on the first surface of the rewiring layer 103.

Specifically, after the package structure obtained in step S10 is turned over for 180 degrees, the patterned dielectric layer 113 and the patterned metal wiring layer 123 are formed on the first surface of the rewiring layer 103 to act as contact layers for the metal bump 111, and then the metal bump 111 is formed on the metal wiring layer 123. The metal bump 111 includes one of a tin solder, a silver solder, and a gold-tin alloy solder. The metal bump 111 may further include a columnar metal connected to the metal bump 111, which is not limited herein.

In conclusion, the fan-out antenna package structure and packaging method according to the present disclosure achieve the following beneficial effects: 1) The present disclosure achieves integration of a plurality of antenna metal layers by using a rewiring layer and metal connecting columns penetrating packaging layers, thereby greatly improving the efficiency and performance of an antenna and improving the conformity of an antenna package structure. 2) In the present disclosure, a semiconductor chip is disposed in the packaging layer to save space and reduce volume of the package structure; on the other hand, the packaging layer can be used to enclose the semiconductor chip while enclosing the metal connecting column, thereby improving the stability of the semiconductor chip and reducing costs. 3) In the present disclosure, metal connecting columns are formed before bonding of the semiconductor chip, so that a bonding surface between the metal connecting column and the rewiring layer is cleaner, and the stability of the metal connecting columns is improved. 4) In the present disclosure, a fan-out antenna fabrication method can effectively reduce the packaging area and volume, to enable the antenna package structure achieves a higher level of density, integration and better packaging performance, and therefore the technique is promising with new application prospect in the field of semiconductor packaging. Therefore, the present disclosure effectively overcomes various disadvantages in the prior art and hence has high industrial use value.

The foregoing embodiments are only to illustrate the principle and efficacy of the present disclosure exemplarily, and are not to limit the present disclosure. Any person skilled in the art can make modifications or variations on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

What is claimed is:

1. A fan-out antenna package structure on a semiconductor chip, comprising:
   a rewiring layer, comprising a first surface and a second surface opposite to the first surface, wherein the semiconductor chip electrically connects to the second surface of the rewiring layer;
   a first metal connecting column, disposed on the second surface of the rewiring layer and electrically connected to the rewiring layer;
   a first packaging layer, deposited on the second surface of the rewiring layer, the first metal connecting column and the semiconductor chip, wherein the first packaging layer covers a top surface of the semiconductor chip in direct contact, and wherein a top surface of the first metal connecting column is exposed from a top surface of the first packaging layer;
   wherein the semiconductor chip comprises a metal column and a metal ball connected to the metal column, and wherein the metal ball connects to the rewiring layer;
   a first antenna metal layer, patterned on the top surface of the first packaging layer and electrically connected to the first metal connecting column;

a second metal connecting column, disposed on the first antenna metal layer, wherein the second metal connecting column is aligned to the first metal connecting column;

a second packaging layer, deposited on the first antenna metal layer and the second metal connecting column, wherein a top surface of the second metal connecting column is exposed from a top surface of the second packaging layer;

a second antenna metal layer, patterned on the top surface of the second packaging layer and electrically connected to the second metal connecting column; and a metal bump, disposed on the first surface of the rewiring layer.

2. The fan-out antenna package structure according to claim 1, the metal column has a height ranging from 25 μm to 250 μm.

3. The fan-out antenna package structure according to claim 2, wherein a side wall of the metal column of the semiconductor chip is embedded in the rewiring layer, and the metal column is electrically connected to the rewiring layer through the metal ball.

4. The fan-out antenna package structure according to claim 1, wherein the first metal connecting columns each is taller than the semiconductor chip.

5. The fan-out antenna package structure according to claim 1, further comprising:

a first metal connecting block provided between the first metal connecting column and the rewiring layer, wherein the first metal connecting block has a lateral cross section larger than that of the first metal connecting column; and a second metal connecting block provided between the second metal connecting column and the first antenna metal layer, wherein the second metal connecting block has a lateral cross section larger than that of the second metal connecting column.

6. The fan-out antenna package structure according to claim 1, wherein the second metal connecting column is shorter than the first metal connecting column.

7. The fan-out antenna package structure according to claim 1, wherein a material of the first packaging layer is one of epoxy resin, polyimide or gel; and wherein a material of the second packaging layer is one of epoxy resin, polyimide or silica gel.

8. The fan-out antenna package structure according to claim 2, wherein the rewiring layer comprises a patterned dielectric layer, and wherein the metal wiring layer is a patterned metal wiring layer and is formed on the patterned dielectric layer.

9. The fan-out antenna package structure according to claim 8, wherein a material of the patterned dielectric layer is one or a combination of epoxy resin, a silica gel, PI, PBO, BCB, silicon oxide, phosphorosilicate glass, and fluorine-containing glass, and wherein a material of the patterned metal wiring layer comprises one or a combination of copper, aluminum, nickel, gold, silver, and titanium.

10. The fan-out antenna package structure according to claim 9, wherein a material of the metal bump comprises one of copper, nickel, tin and silver.

* * * * *